(12) United States Patent
Hauf et al.

(10) Patent No.: US 9,081,292 B2
(45) Date of Patent: Jul. 14, 2015

(54) ARRANGEMENT FOR ACTUATING AN ELEMENT IN A PROJECTION EXPOSURE APPARATUS

(71) Applicant: Carl Zeiss SMT GmbH, Oberkochen (DE)

(72) Inventors: Markus Hauf, Ulm (DE); Ulrich Schoenhoff, Neu-Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 35 days.

(21) Appl. No.: 14/022,819

(22) Filed: Sep. 10, 2013

(65) Prior Publication Data

US 2014/0016109 A1    Jan. 16, 2014

Related U.S. Application Data

(63) Continuation of application No. PCT/EP2012/056628, filed on Apr. 12, 2012.

(60) Provisional application No. 61/483,153, filed on May 6, 2011.

(30) Foreign Application Priority Data

May 6, 2011    (DE) .......................... 10 2011 075 393

(51) Int. Cl.
*G03B 27/58*    (2006.01)
*G03B 27/54*    (2006.01)
*G03F 7/20*    (2006.01)

(52) U.S. Cl.
CPC .............. *G03F 7/70* (2013.01); *G03F 7/70766* (2013.01); *G03F 7/70825* (2013.01)

(58) Field of Classification Search
CPC . G03F 7/709; G03F 7/70825; G03F 7/70258; F03F 7/70766
USPC ................... 355/52, 53, 67, 72; 359/819–820
See application file for complete search history.

(56) References Cited

U.S. PATENT DOCUMENTS 6,788,386 B2    9/2004    Cox et al.
7,443,619 B2    10/2008    Sakino et al.
(Continued)

FOREIGN PATENT DOCUMENTS

EP        1 321 822        6/2003
WO    WO 96/38766        12/1996
WO    WO 2009/115205    9/2009

OTHER PUBLICATIONS

International Search Report and Written Opinion for corresponding PCT Appl. No. PCT/EP2012/056628, mailed Jun. 25, 2012.
(Continued)

*Primary Examiner* — Hung Henry Nguyen
(74) *Attorney, Agent, or Firm* — Fish & Richardson P.C.

(57) ABSTRACT

The invention relates to an arrangement for actuating an element in an optical system of a projection exposure apparatus, wherein the projection exposure apparatus has a carrying frame, comprising at least one actuator for exerting controllable forces on the element, wherein the actuator has a first actuator part, which is coupled to the carrying frame via at least one mechanical filter, and a second actuator part, which is mechanically coupled directly to the carrying frame, and wherein the loading on the first actuator part is at least partly relieved by the second actuator part when forces are exerted on the element.

41 Claims, 6 Drawing Sheets

(56) References Cited

U.S. PATENT DOCUMENTS

2003/0197914 A1* 10/2003 Cox et al. ............... 359/223
2005/0275822 A1   12/2005 Butler
2007/0286035 A1* 12/2007 Uchida ................ 369/44.14
2010/0321662 A1   12/2010 Butler
2014/0346909 A1* 11/2014 Vogler et al. ............ 310/105

OTHER PUBLICATIONS

German Office Action, with translation thereof, for corresponding DE Appl No. 10 2011 075 393.1, dated Jan. 18, 2012.
The International Preliminary Report on Patentability for corresponding PCT Appl. No. PCT/EP2012/056628, issued Nov. 12, 2013.

* cited by examiner

ARRANGEMENT FOR ACTUATING AN ELEMENT IN A PROJECTION EXPOSURE APPARATUS

CROSS REFERENCE TO RELATED APPLICATIONS

This application is a continuation of, and claims benefit under 35 USC 120 to, international application PCT/EP2012/056628, filed Apr. 12, 2012, which claims priority of German Patent Application DE 10 2011 075 393.1 and U.S. 61/483,153, both filed on May 6, 2011. The contents of these applications are hereby incorporated by reference.

BACKGROUND OF THE INVENTION

1. Field of the Invention

The invention relates to an arrangement for actuating an element in a projection exposure apparatus.

2. Prior Art

Microlithography is used for producing microstructured components such as, for example, integrated circuits or LCDs. The microlithography process is carried out in a so-called projection exposure apparatus having an illumination device and a projection lens. The image of a mask (=reticle) illuminated via of the illumination device is in this case projected via the projection lens onto a substrate (e.g. a silicon wafer) coated with a light-sensitive layer (photoresist) and arranged in the image plane of the projection lens, in order to transfer the mask structure to the light-sensitive coating of the substrate.

In a projection exposure apparatus designed for EUV (i.e. for electromagnetic radiation having a wavelength of less than 15 nm), for lack of light-transmissive materials being available, mirrors are used as optical components for the imaging process. The mirrors can be fixed on a carrying frame (also designated as "force absorbing frame" or "force frame") and can be designed to be at least partly manipulatable in order to enable the respective mirror to be moved for example in six degrees of freedom (i.e. with regard to displacements in the three spatial directions x, y and z and with regard to rotations $R_x$, $R_y$ and $R_z$ about corresponding axes), as a result of which it is possible, for instance, to compensate for changes in the optical properties that occur during the operation of the projection exposure apparatus, e.g. on account of thermal influences. Furthermore, in addition to the carrying frame, a sensor frame mechanically decoupled from the latter can be provided.

In this case, the respective mirror position relative to the sensor frame can be measured via a position sensor and can be set to the desired value via a controller via an actuator. In this case, during the operation of the projection exposure apparatus, the problem then occurs in principle that every force exerted on an element such as the respective mirror, for example, by an actuator, on the basis of the Newtonian principle "actio=reactio", is accompanied by a reaction force of equal magnitude acting in the opposite direction. Action of the reaction force on the sensor frame during the operation of the projection exposure apparatus would have the consequence, however, of the sensors provided on the sensor frame measuring substantially only parasitic dynamics, and should therefore be prevented.

Known approaches for overcoming this problem include the use of a mechanical filter in the form of a spring-mass system on the force path between mirror and sensor frame. With regard to the prior art, reference is made to U.S. Pat. No. 6,788,386 B2, for example.

FIG. 5 illustrates merely schematically a typical conventional construction, wherein the mirror is designated by "10", the sensor frame is designated by "20" and the carrying frame is designated by "30". The actuator A, which is driven via a controller (not depicted in FIG. 5) in accordance with the signal supplied by the position sensor P for the actuation of the mirror 10, can be coupled to the carrying frame 30 via a mechanical filter in the form of a spring-mass system composed of a mass 15 and a spring 16.

In the case of mechanical filters, the suppression of the actuator forces depends on the relative distance between the excitation frequency and the filter frequency. In this case, the filter frequency $f_F$ is given by $$f_F = \frac{1}{2\pi} \cdot \sqrt{\frac{k}{m}} \quad (1)$$

where k denotes the spring stiffness of the spring-mass system forming the mechanical filter and m denotes the filter mass of the mechanical filter.

An exemplary transfer function of the reaction force suppression (i.e. "actuator force" with respect to "force on the carrying structure") is shown in FIG. 4, wherein the frequency (in arbitrary units) is plotted logarithmically on the horizontal axis. Excitations in the frequency range below the filter frequency $f_F$ are not suppressed. Above the filter frequency $f_F$, the actuator forces are increasingly suppressed with a gradient of −40dB/decade. Once the filter frequency has been chosen, then the static deflections (in the region of the stiffness line) and the dynamic deflections for a given actuator force spectrum are dependent on the absolute value of the filter mass chosen.

This has the consequence e.g. for actuators that have to carry relatively large static loads that large to impracticable (>1 cm) static deflections can occur especially at low filter frequencies (<100 Hz) on account of the small spring stiffnesses. That could admittedly be counteracted, in principle, by using large reaction masses, but that often cannot be realized on account of structural space limitations. Consequently, in order to suppress the reaction forces that occur, comparatively large filter masses are required, the integration of which into an EUV system with limited structural space available is problematic or even impossible. This increasingly applies to high-aperture EUV systems (for example EUV systems having a numerical aperture NA of greater than 0.3), in which generally the arrangement of the mirrors themselves without disturbing the optical beam path already constitutes a demanding challenge.

SUMMARY OF THE INVENTION

It is an object of the present invention to provide an arrangement for actuating an element in a projection exposure apparatus which, in conjunction with a compact construction, enables the element to be actuated in a manner as free of disturbances as possible.

This object is achieved via an arrangement for actuating an element in an optical system of a projection exposure apparatus, wherein the projection exposure apparatus has a carrying frame. The arrangement includes at least one actuator for exerting controllable forces on the element. The actuator has a first actuator part, which is coupled to the carrying frame via at least one mechanical filter, and a second actuator part, which is mechanically coupled directly to the carrying frame.

The loading on the first actuator part is at least partly relieved by the second actuator part when forces are exerted on the element.

An arrangement for actuating an element in an optical system of a projection exposure apparatus, wherein the projection exposure apparatus has a carrying frame, comprises:
- at least one actuator for exerting controllable forces on the element;
- wherein the actuator has a first actuator part, which is coupled to the carrying frame via at least one mechanical filter, and a second actuator part, which is mechanically coupled directly to the carrying frame; and
- wherein the loading on the first actuator part is at least partly relieved by the second actuator part when forces are exerted on the element.

In accordance with one embodiment, the mechanical filter has a filter frequency, wherein the arrangement is designed in such a way that forces exerted on the element by the actuator are exerted on the element with a frequency below the filter frequency at least predominantly by the second actuator part.

The invention is based on the insight that, in principle, only the reaction forces accompanying the comparatively high-frequency forces of the actuator have a disturbing influence on the carrying frame or the dynamics of the overall system. Although the high-frequency forces of the actuator and respectively the accompanying reaction forces are relatively low per se, the reaction forces can excite natural oscillation modes in the carrying frame. The risk is that the excited oscillation modes will feed back to the actuator via sensor and controller and thus cause stability problems in the control loop or restrict its control quality. Consequently, it is necessary to suppress reaction forces in the relatively high-frequency range or it is necessary to prevent them from coming through to the carrying frame. By contrast, the comparatively low-frequency forces and respectively the accompanying reaction forces, on account of the circumstance that no natural oscillation modes occur in the carrying frame in the relevant low-frequency range, do not cause further disturbance for the stability and control quality of the control loop, for which reason the low-frequency forces are permitted to be "transmitted" to the carrying frame.

Proceeding from this insight, the invention is based on the concept of dividing the actuator into a first actuator part, which is "responsible" for generating high-frequency forces, and a second actuator part, which is "responsible" for generating low-frequency forces, wherein the reaction forces (arising on account of the "actio=reactio" principle) corresponding to the high-frequency forces generated by the first actuator part are passed to a reaction mass or filter mass of a mechanical filter, whereas the second actuator part, which generates the low-frequency forces, is supported mechanically directly (i.e. without additional reaction mass or without interposition of a mechanical filter) against the carrying frame.

In other words, according to the invention an actuator effectively "split up" in terms of frequency is used between element and carrying structure, wherein the reaction forces accompanying the high-frequency forces of the actuator or of the first actuator part thereof are mechanically filtered, but the remaining (low-frequency) forces of the actuator or of the second actuator part thereof are transmitted to the carrying frame without being filtered. This "splitting up" of the actuator can, as will also be explained in greater detail below, be effected in such a way that a (correction) force to be exerted on the element overall by the actuator is firstly passed to the first actuator part and then the constant or low-frequency forces are "pulled over" gradually, for instance as described below with the use of an integrating unit, to the second actuator part, which is intended for load relief. Consequently, the invention does not necessarily include from the outset during the driving of the actuator a frequency division into different frequency ranges (as is effected for instance in the case of a loudspeaker constructed from tweeter and woofer), but rather can also be realized by an effective splitting up of the actuator by realizing a suitable signal flow. Alternatively, this splitting can be effected via a network or via an analog or digital filter which splits the force signal into two components in such a way that the sum thereof is equal to the input signal and one component includes the static and low-frequency portions and the other component includes the high-frequency portions.

The (in the above sense "effective") splitting according to the invention of the actuator into a higher-frequency and a low-frequency actuator part and the separate or different treatment—thereby made possible—of the reaction forces proceeding from the actuator parts now has the consequence that comparatively large constant forces can be generated by the second actuator part, which is mechanically linked directly to the carrying frame, and, in this respect, a mechanical filter mass is not required, such that the filter mass ultimately required only for the reaction forces on account of the forces generated by the first actuator part can be designed to be significantly smaller and the actuator can therefore be designed to be significantly more compact overall.

Furthermore, all forces applied by a control can be transmitted via the actuator without a reaction mass and the reaction mass deflections caused by the forces can thereby be avoided. One example is the acceleration forces for a movement of the mirror, the acceleration forces usually being generated by a desired-value generator.

In other words, the filter mass ultimately required overall in the construction according to the invention can be designed to be significantly smaller in comparison with an arrangement in which the entire actuator is mechanically coupled to the carrying frame via a mechanical filter (i.e. in comparison with a mechanical filtering of all the reaction forces), since, via the splitting or "frequency splitting" according to the invention of the actuator, the filter mass is freed of constant forces occurring.

As a result, it becomes possible, in particular, to arrange the actuator designed according to the invention, on account of its compactness, in direct proximity to the respective optical element (e.g. mirror). This makes it possible to better take account of the structural space limitations existing precisely in the case of high-aperture EUV systems.

The mechanical filter provided according to the invention between the first actuator part and the carrying structure, or the filter frequency of the filter, is preferably designed such that a sufficiently great suppression of the reaction forces accompanying the actuator forces is present in that frequency range in which critical natural oscillation modes or resonances commence in the structure of the carrying frame. The frequency division into different frequency ranges that is to be carried out during the driving of the actuator can, as will be explained in greater detail below, be effected for example via a network or via an analog or digital filter.

In accordance with one embodiment, the arrangement is designed in such a way that static forces or forces exerted on the element by the actuator are exerted with a frequency below the filter frequency to the extent of at least 80%, in particular to the extent of at least 90%, more particularly to the extent of at least 95%, by the second actuator part.

The mechanical filter assigned to the first actuator part can have, in particular, a filter frequency in the range of 2 Hz to 100 Hz.

In accordance with one embodiment, the arrangement has a controller, which controls forces exerted on the element by the actuator in a manner dependent on a sensor signal characteristic of the position of the element. The controller can communicate a controller output variable determined on the basis of the sensor signal to the first actuator part. Furthermore, the controller can have an integrating unit, which integrates a portion of the controller output variable that is temporally constant or has a frequency below the filter frequency of the mechanical filter and assigns it to the second actuator part.

The invention is not restricted to specific designs of actuators. In some embodiments, the first actuator part and/or the second actuator part can have at least one Lorentz actuator having a coil, to which an electric current can be applied, and a permanent magnet. In this case, in particular, a filter mass of the mechanical filter can be formed by the permanent magnet of the first actuator part.

The element to be actuated according to the invention can be, in particular, a mirror, a lens element or else a movable table for positioning an optical element, in particular a reticle, or an element to be processed or inspected such as e.g. a wafer.

The invention furthermore relates to a projection exposure apparatus comprising an arrangement according to the invention. The projection exposure apparatus can be designed, in particular, for operation in the EUV. In further applications, the projection exposure apparatus can also be designed for operation in the VUV range, for example for wavelengths of less than 200 nm, in particular less than 160 nm.

Further configurations of the invention can be gathered from the description and the dependent claims.

The invention is explained in greater detail below on the basis of exemplary embodiments illustrated in the accompanying figures.

DETAILED DESCRIPTION OF PREFERRED EMBODIMENTS

Figure 1:
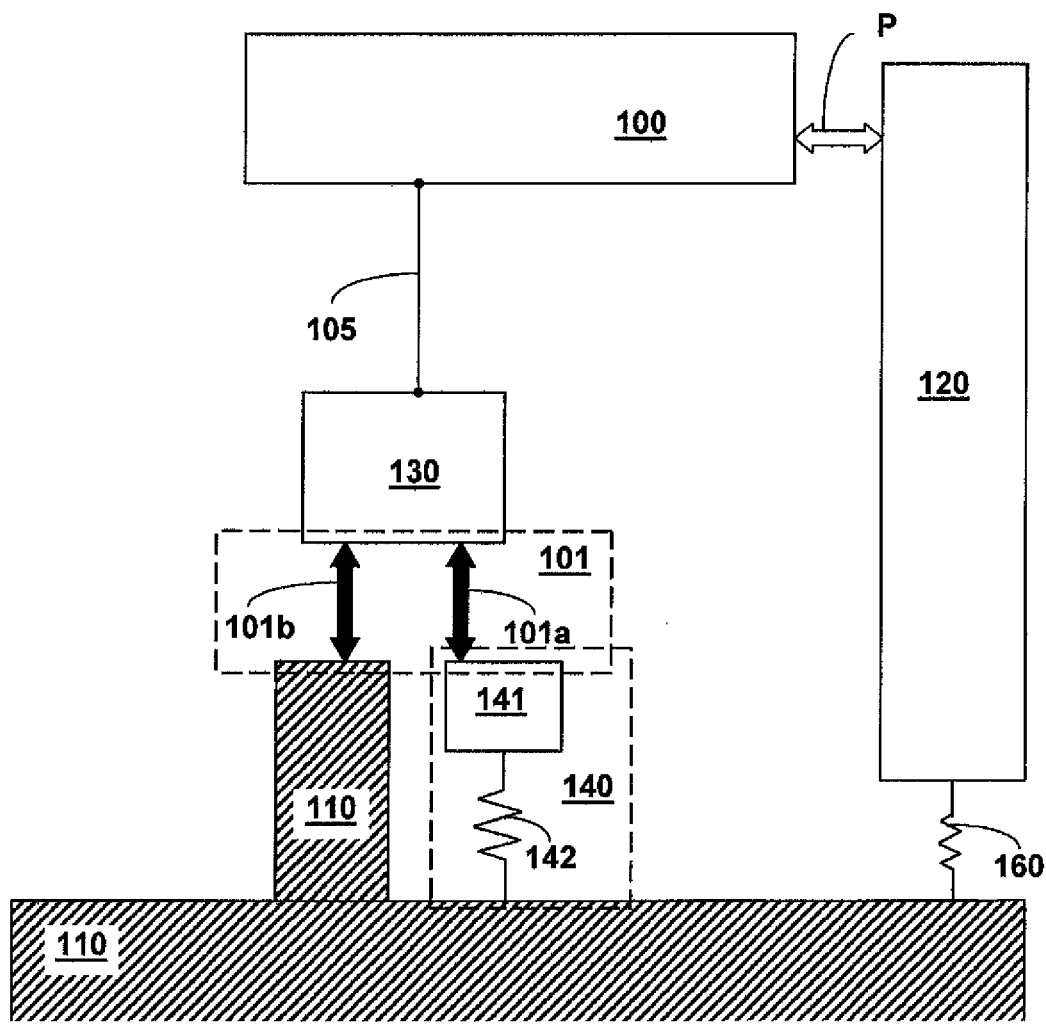
FIG. 1 shows a schematic illustration for elucidating the concept according to the invention.

FIG. 1 firstly shows a basic schematic diagram for elucidating the concept on which the invention is based.

In the arrangement shown in FIG. 1, controllable forces can be applied to an optical element in the form of a mirror 100 via an actuator. Firstly a carrying frame 110 and a sensor frame 120 are illustrated schematically, wherein the mechanical decoupling between carrying frame 110 and sensor frame 120 is symbolized via a spring 160.

As further embodiments, sensor frame and carrying frame can be connected by a rigid, preferably isostatic, mounting. A carrying frame that simultaneously serves as a sensor frame is also conceivable.

The arrangement from FIG. 1 comprises, in particular, an actuator 101 having two separate actuator drives or actuator parts 101a and 101b symbolized via double-headed arrows, between mirror and actuator 101 an optional mechanical filter consisting of a mass 130 and a spring element 105, and between the first actuator part 101a and the carrying frame 110 a mechanical filter 140 consisting of a filter mass 141 and a spring element 142. As can likewise be seen from FIG. 1, the second actuator part 101b is mechanically linked directly to the carrying frame 110.

The mechanical linking of the actuator 101 having the two actuator drives 101a and 101b to the mirror 100, which linking is illustrated in the exemplary embodiment via a mass-spring system composed of mass 130 and spring element 105 (e.g. in the form of a possibly elastic pin), can be effected in any suitable manner and as such is not the subject matter of the present invention.

The construction of an actuator 201 in accordance with one embodiment of the invention is explained in greater detail below with reference to FIG. 2, wherein components corresponding or substantially functionally identical to FIG. 1 are designated by corresponding reference numerals increased by "100". The construction of the actuator 201 is "split" according to the invention in so far as the actuator 201 is constructed from two separate actuator parts 201a and 201b, wherein one of these actuator parts (namely the second actuator part 201b) serves to relieve the other of the actuator parts (namely the first actuator part 201a) of low-frequency and constant force components with regard to the forces to be exerted on the mirror 200. The two actuator parts 201a and 201b of the actuator 201 are once again symbolized via double-headed arrows.

These double-headed arrows simultaneously show the direction of the forces exerted by the two actuator parts 201a, 201b of the actuator 201, and of the reaction forces accompanying the forces. On account of the Newtonian principle "actio=reactio", every force exerted on the mirror 200 by the actuator 201 is accompanied by a reaction force of equal magnitude reacting in the opposite direction.

According to the invention, the high-frequency reaction forces which go back to the effect of the first actuator part 101a or 201a and remain on account of the load relieving by the second actuator part 101b or 201b are transmitted to the carrying frame 110 or 210 via the mechanical filter 140 or 240, whereas the reaction forces which go back to the effect of the second actuator part 101b, 201b of the corresponding actuator drive 101, 201 are transmitted directly (i.e. without an interposed mechanical filter) to the carrying frame 110, 210. On account of the above-described relieving of the load on the first actuator part 201a or the corresponding actuator drive by the second actuator part 201b or the corresponding actuator drive, the forces ultimately exerted on the mirror 200 by the second actuator part 201b and thus also the reaction forces accompanying the forces are low-frequency or constant forces.

Figure 2:
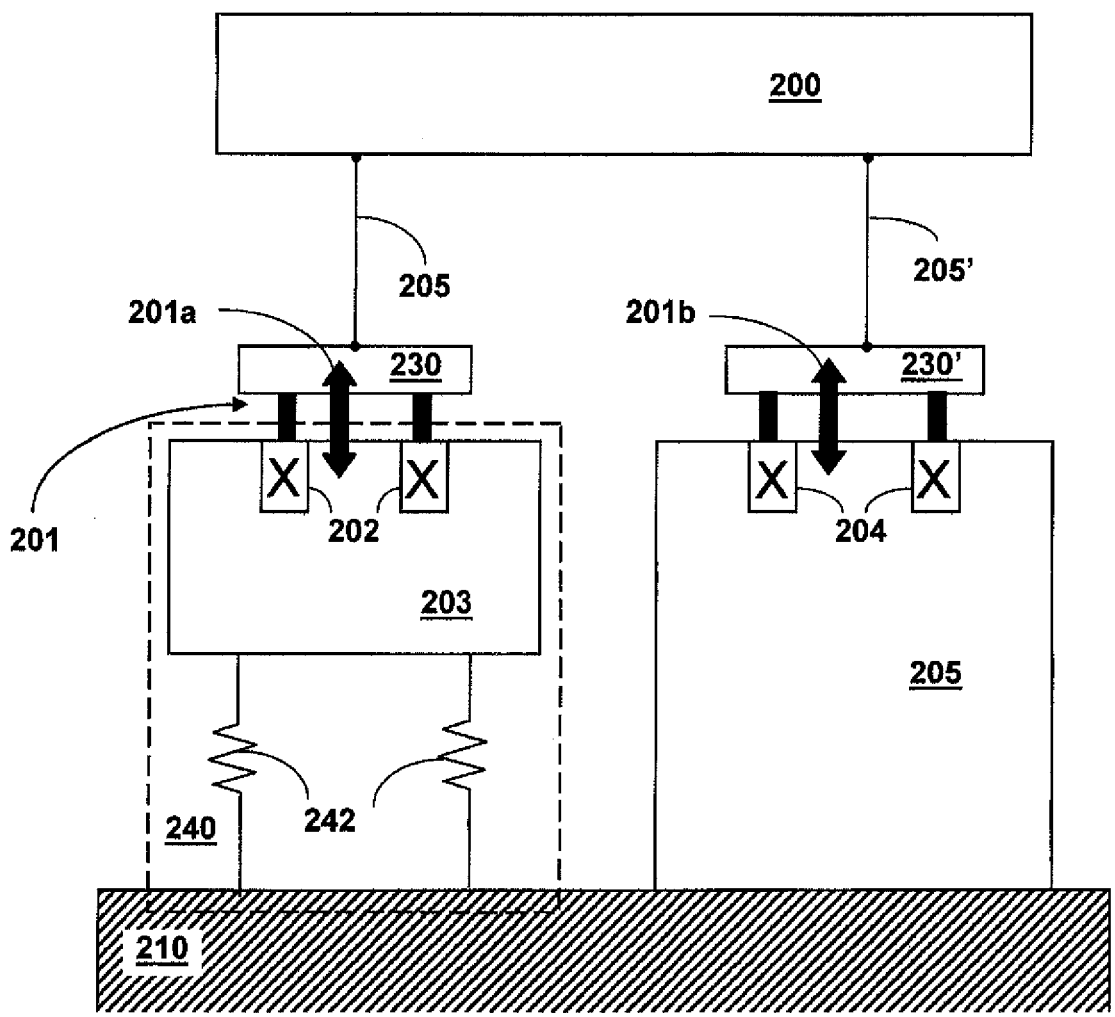
FIG. 2 shows a schematic illustration for elucidating the construction of an actuator used in the invention in accordance with one embodiment.

In accordance with FIG. 2, in the exemplary embodiment, and without the invention being restricted thereto, both the first actuator part 201a and the second actuator part 201b are realized in the form of Lorentz actuators (so-called moving coil drives or "voice coil actuators"), each having a coil 202 and 204, respectively, to which electric current can be applied, and a permanent magnet 203 and 205, respectively, in such a way that a force that can be controlled by an electric current being applied to the coils 202 and 204 acts between coil 202 and 204, respectively, and permanent magnet 203 and 205, respectively. In the concrete exemplary embodiment, the arrangement of coil and assigned permanent magnet is realized as a moving coil arrangement in which the coil 202 and 204 respectively descends into a circumferential slot with a radial magnetic field. In the example of FIG. 2, the respective coil 202 and 204 is coupled to the mirror 200 mechanically via the pin 205 and 205', respectively, and movable together with the mirror 200.

In further embodiments, the permanent magnets can also be embodied in moveable fashion and the coils in stationary fashion, that is to say that it is possible to choose an arrangement opposite to FIG. 2 insofar as the respective permanent magnet 203 and 205 is coupled to the mirror 200 mechanically via the pin 205 and 205', respectively, and movable together therewith.

Furthermore, in embodiments of the invention, it is also possible to combine a plurality of actuators for actuating a plurality of degrees of freedom, preferably for actuating two degrees of freedom, in one actuator unit and to couple them jointly to the mirror.

In a further embodiment, the actuator 201b can be relieved of the weight forces of the mirror by a mechanical or a magnetic weight force compensator, such that the actuator 201b only has to take over variations of the constant forces. Such variations can be caused e.g. by setting tolerances of the weight force compensator, by ageing effects thereof, by the location dependence of the gravitational constant, by the dependence of the constant forces on the mirror position and by the alignment tolerances of the carrying structure relative to the direction of the gravitational force vector.

As already explained with reference to FIG. 1 and FIG. 2, the high-frequency reaction forces which go back to the effect of the first actuator part 101a and 202a, respectively, are transmitted to the carrying frame 110, 210 via a mechanical filter 140, 240. The mechanical filter 140, 240 is designed as a mass-spring system, wherein in FIG. 2 the permanent magnet 203 simultaneously provides the filter mass that is mechanically coupled to the carrying frame 210 via springs 242. The springs 242 can be designed in any suitable manner (e.g. as leaf springs, helical springs or in the form of other known spring designs).

In contrast thereto, as can be discerned in the right-hand part of FIG. 2, the permanent magnet 205 is directly coupled to the carrying frame 210, such that the low-frequency reaction forces which go back to the effect of the second actuator part 201b are transmitted to the carrying frame 210 without being filtered. The actuator 201 according to the invention is therefore designed in such a way that in the critical high frequency range (e.g. at frequencies above 100 Hz) a decoupling is effected in the reaction force path on account of the reaction mass or filter mass of the mechanical filter 240 provided between the first actuator part 201a and the carrying structure 210.

Even though, in the exemplary embodiment illustrated, the reaction or filter mass of the mechanical filter provided between the first actuator part and the carrying frame is formed by the permanent magnet of the Lorentz actuator forming the first actuator part 201a, the invention is not restricted thereto. Thus, in other embodiments, the reaction or filter mass of the mechanical filter can also be embodied separately from the permanent magnet 203 as an additional mass. Furthermore, the invention can also be realized with any other suitable force actuators, that is to say is not restricted to the Lorentz actuators described above.

The mechanical filter formed by the spring-mass system 140 composed of filter mass 141 and spring 142 between the first actuator part 101a and the carrying structure 110, or the filter frequency of the filter, is designed such that a sufficiently great suppression of the reaction forces accompanying the actuator forces of the first actuator part 101a is present as far as possible in that frequency range in which critical natural oscillation modes or resonances commence in the structure of the carrying frame 110.

Figure 3:
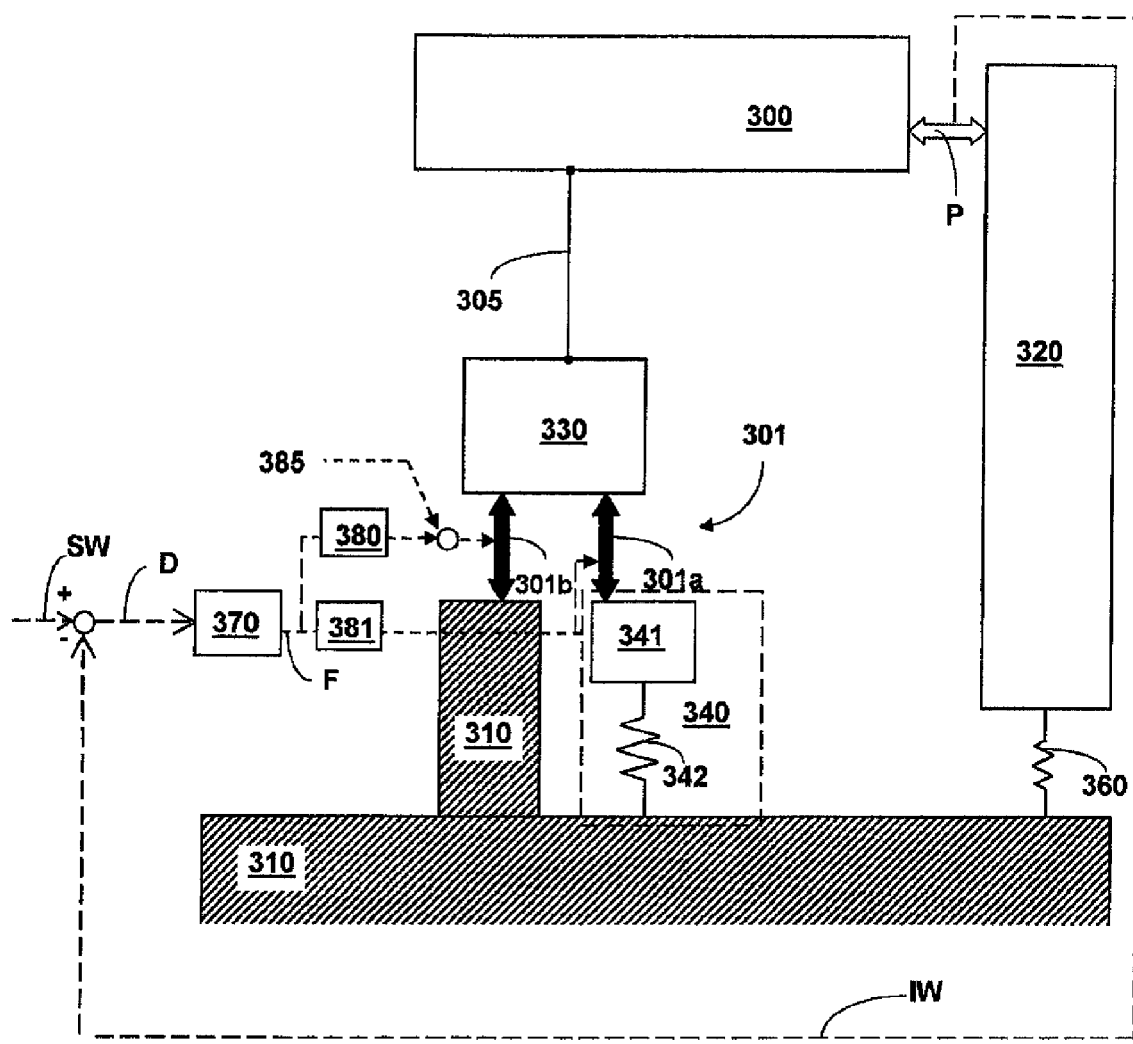
FIG. 3 shows a schematic illustration for elucidating a further embodiment of the invention.
Figure 4:
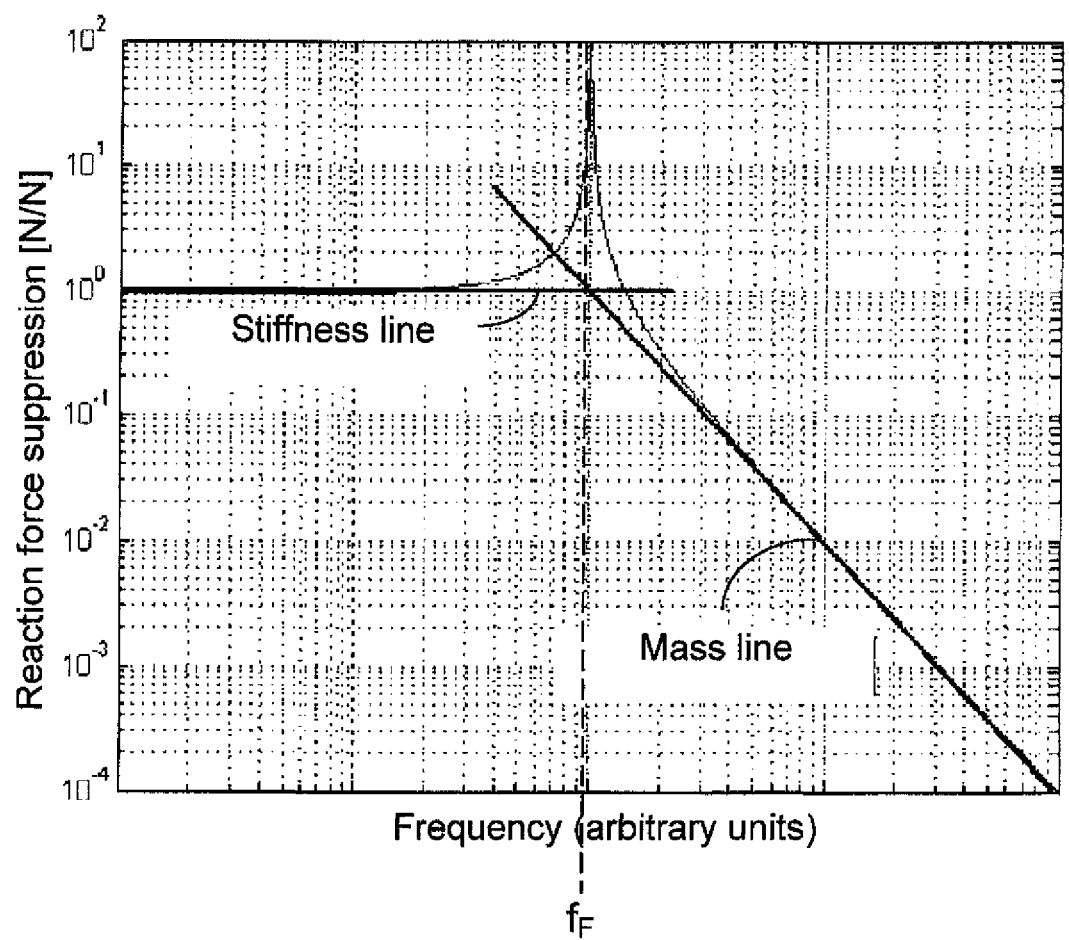
FIG. 4 shows a diagram for elucidating an exemplary transfer function of a mechanical filter.
Figure 5:
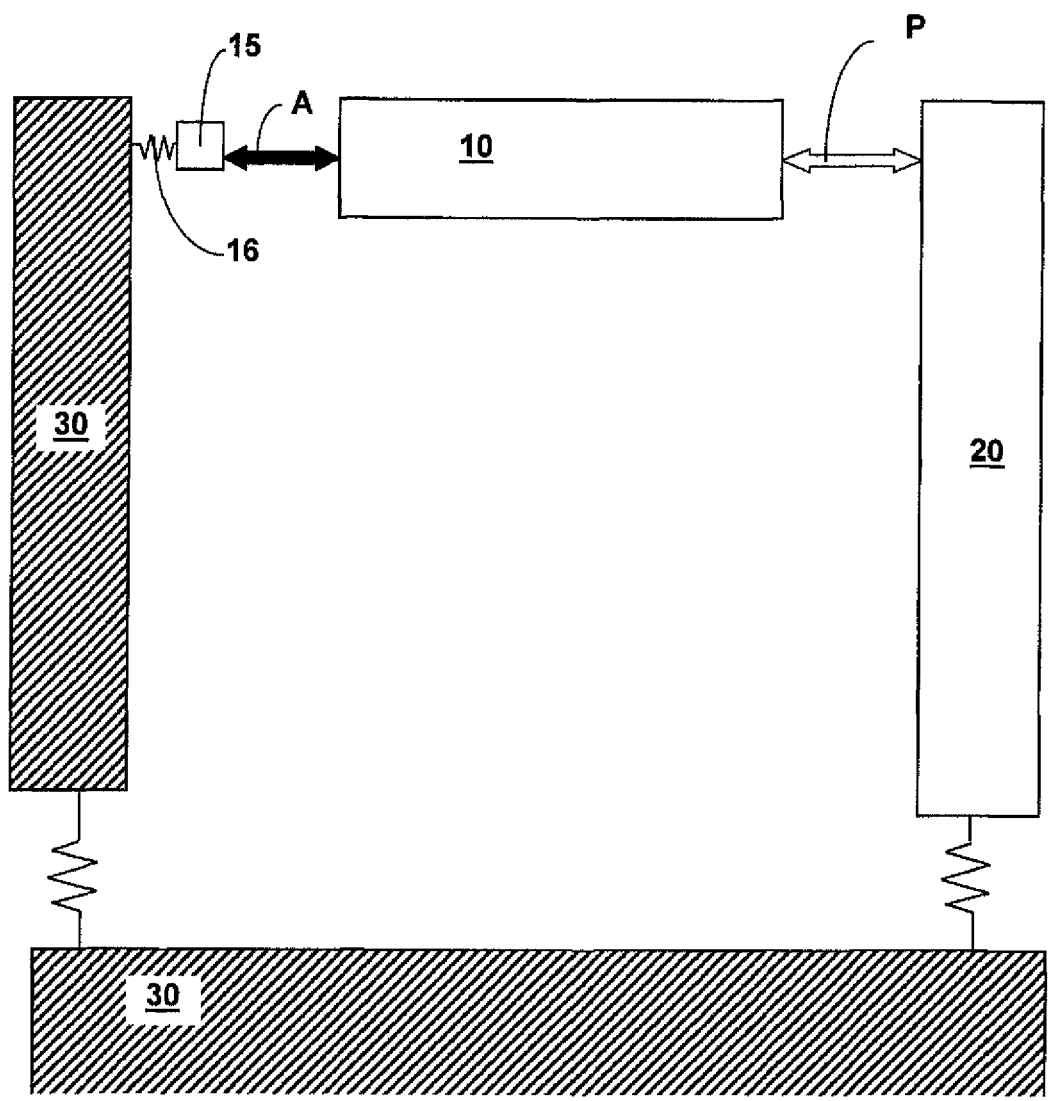
FIG. 5 shows a schematic illustration for elucidating a problem that occurs in accordance with the prior art.

One possible signal flow is described on the basis of an embodiment such as is illustrated in FIG. 3, wherein components corresponding or substantially functionally identical to FIG. 1 are designated by corresponding reference numerals increased by "200".

The arrangement shown in FIG. 3 comprises, proceeding from the basic construction from FIG. 1, a controller 370, which controls the forces exerted on the optical element 300 by the actuator 301 in a manner dependent on a sensor signal characteristic of the position of the optical element 300. The sensor signal is generated by a position sensor P, which measures the position of the mirror 100 relative to a reference structure. The actual value IW corresponding to the sensor signal is compared, in accordance with FIG. 3, with a desired value SW and the difference D is fed to the controller 370, which correspondingly communicates a controller output variable F in the form of a correcting force to the actuator 301.

Generally, for realizing the actuator effectively "split up" according to the invention in accordance with FIG. 3, it is possible to realize a frequency-dividing network comprising a low-pass filter 380 and a high-pass filter 381. "385" designates a signal from the control (e.g. a precontrol signal that does not lead to instabilities but contributes to the load relieving of the feedback control loop) which can be passed directly to the second actuator part 301b.

In one preferred embodiment, the low-pass filter 380 can be realized as an integrating unit. The high-pass filter then forms an element having a gain of the value one. In this case, in this preferred exemplary embodiment, this communication of the correcting force by the controller 370 is effected firstly to the first actuator part 301a, but the first actuator part 301a is subsequently relieved with regard to the low-frequency forces and the constant forces by the second actuator part 301b. Without this load relieving (i.e. particularly with inclusion of the constant forces), undesirably high deflections would occur in the mechanical filter 340 in the case of the comparatively low spring stiffness used there according to the invention. In order to realize the load relieving, the arrangement in accordance with FIG. 3 now has an integrating unit forming the low-pass filter 380, which integrating unit integrates a portion of the controller output variable F, which has a frequency below the filter frequency of the mechanical filter 340 (wherein the filter frequency can be e.g. in the range of 2 Hz to 100 Hz), and assigns it to the second actuator part 301b insofar as it "pulls over" the corresponding constant portions successively to the second actuator part. The constant force portions integrated in this way are thus exerted on the mirror 300 by the second actuator part 301b directly linked to the carrying structure 310, such that the first actuator part 301a is relieved of force portions.

As a result, the filter mass 341 of the mechanical filter 340 used for mechanically decoupling the first actuator part 301a can be designed to be significantly smaller than if the entire correcting force had to be taken over by the first actuator part 301a. Consequently, in conjunction with a significantly more compact construction, a largely disturbance-free actuation of the mirror 300 is made possible.

Figure 6:
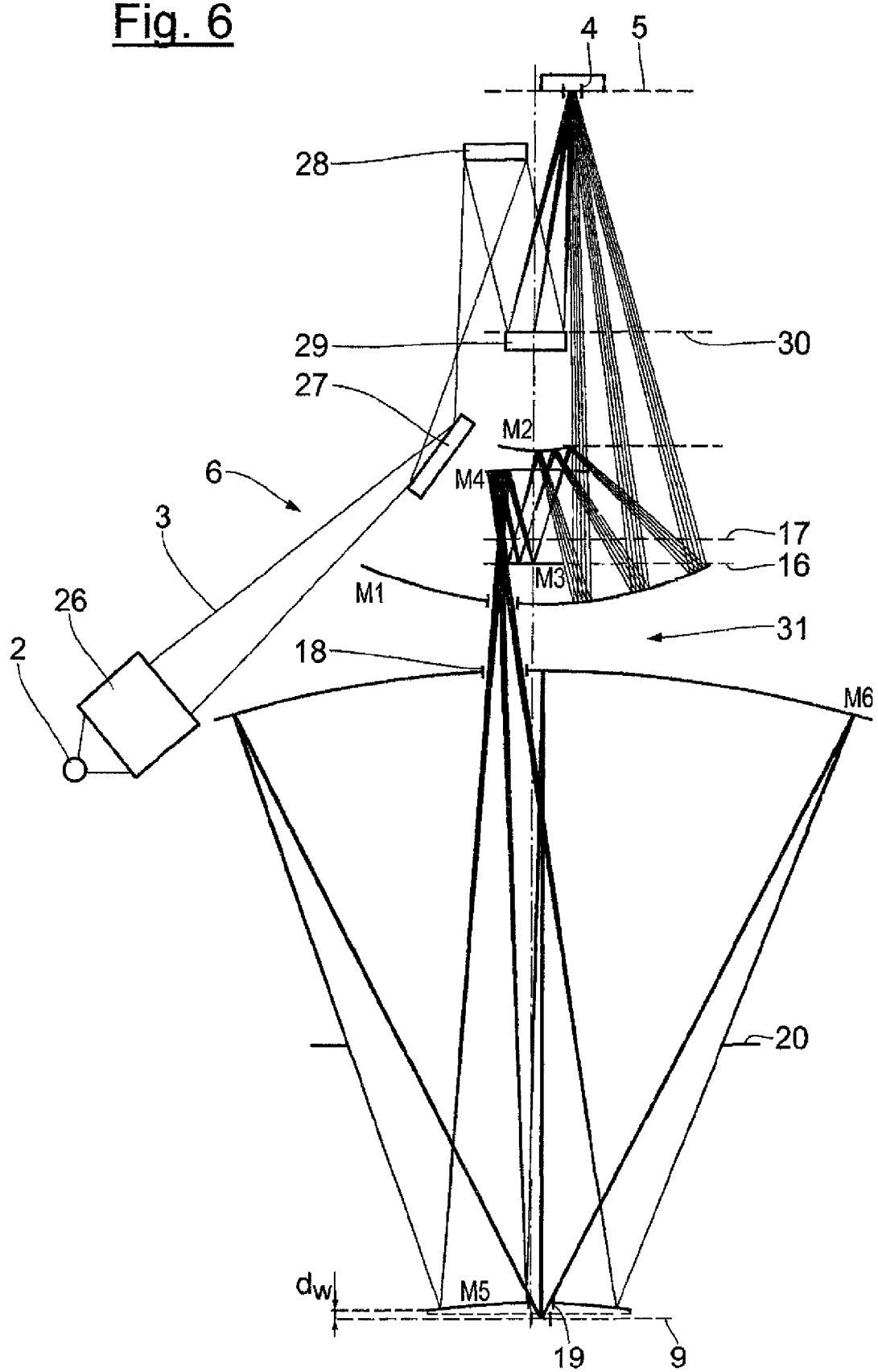
FIG. 6 shows a schematic illustration of a lithographic projection exposure apparatus designed for operation in the EUV.

FIG. 6 shows in schematic illustration a lithographic projection exposure apparatus designed for operation in the EUV, in which apparatus the present invention can be realized, for example.

The projection exposure apparatus in accordance with FIG. 6 comprises an illumination device 6 and a projection lens 31. The illumination device 6 comprises, in the light propagation direction of the illumination light 3 emitted by a light source 2, a collector 26, a spectral filter 27, a field facet mirror 28 and a pupil facet mirror 29, from which the light impinges on an object field 4 arranged in an object plane 5. The light emerging from the object field 4 enters into the projection lens 31 with an entrance pupil 30. The projection lens 31 has an intermediate image plane 17, a first pupil plane 16 and a further pupil plane with a stop 20 arranged therein. The projection lens 31 comprises a total of six mirrors M1-M6. M6 designates the last mirror relative to the optical beam path, the mirror having a passage hole 18. A beam of rays emerging from the object field 4 or reticle arranged in the object plane passes, after reflection at the mirrors M1-M6 for generating an image of the reticle structure to be imaged, onto a wafer arranged in the image plane 9.

Even though the invention has been described on the basis of specific embodiments, numerous variations and alternative embodiments are apparent to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An arrangement, comprising:
   a carrying frame;
   a mechanical filter having a frequency;
   an actuator configured to exert forces on an element in an optical system of a projection exposure apparatus, the actuator comprising:
      a first actuator part coupled to the carrying frame via the mechanical filter; and
      a second actuator part mechanically coupled directly to the carrying frame; and
   a controller configured to control the forces exerted on the element by the actuator based on a sensor signal characteristic of a position of the element,
   wherein when the actuator exerts forces on the element:
      a loading on the first actuator part is at least partly relieved by the second actuator part;
      forces exerted on the element with a frequency below the filter frequency of the mechanical filter are at least predominantly exerted by the second actuator part, and
   wherein:
      the controller is configured to communicate a controller output variable determined on the basis of a sensor signal to the first actuator part; and
      the controller comprises an integrating unit configured to: a) integrate a portion of the controller output variable that is temporally constant or has a frequency below the filter frequency of the mechanical filter; and b) assign the controller output variable to the second actuator part.

2. The arrangement of claim 1, wherein, when the actuator exerts forces on the element, at least 80% of the forces exerted on the element with a frequency below the filter frequency of the mechanical filter are exerted by the second actuator part.

3. The arrangement of claim 1, wherein the arrangement is configured so that, when the actuator exerts forces on the element, at least 80% of static forces exerted on the element by the actuator are exerted by the second actuator part.

4. The arrangement of claim 1, wherein the filter frequency of the mechanical filter is in the range of 2 Hz to 100 Hz.

5. An arrangement, comprising:
   a carrying frame;
   a mechanical filter having a frequency; and
   an actuator configured to exert forces on an element in an optical system of a projection exposure apparatus, the actuator comprising:
      a first actuator part coupled to the carrying frame via the mechanical filter; and
      a second actuator part mechanically coupled directly to the carrying frame,
   wherein when the actuator exerts forces on the element:
      a loading on the first actuator part is at least partly relieved by the second actuator part; and
      forces exerted on the element with a frequency below the filter frequency of the mechanical filter are at least predominantly exerted by the second actuator part, and
   wherein the arrangement is configured so that, during driving of the actuator, an input signal defining an overall force to be exerted on the element by the actuator is split into signals corresponding to different frequency ranges, a sum of the signals being equal to the input signal.

6. The arrangement of claim 5, wherein the arrangement comprises a filter configured to split the input signal into signals based on the different frequency ranges, and the filter comprises at least one member selected from the group consisting of an analog filter and a digital filter.

7. The arrangement of claim 1, wherein the arrangement is configured so that the forces to be exerted on the element by the actuator comprise forces which are predefined by a control, and the predefined forces are exerted on the element by the second actuator part.

8. The arrangement of claim 1, wherein at least one actuator part comprises a Lorentz actuator comprising a coil and a permanent magnet, the at least one actuator comprising at least one member selected from the group consisting of the first actuator part and the second actuator part.

9. The arrangement of claim 1, wherein the first actuator part comprises a Lorentz actuator comprising a coil and a permanent magnet, and the permanent magnet is a filter mass of the mechanical filter.

10. The arrangement of claim 1, further comprising the element, wherein the element comprises a mirror.

11. The arrangement of claim 1, further comprising the element, wherein the element comprises a lens.

12. The arrangement of claim 1, further comprising the element, wherein the element comprises a movable table configured to position an element, wherein the element is selected from the group consisting of a member to be imaged, a member to be processed, and a member to be inspected.

13. An arrangement, comprising:
   a carrying frame;
   a mechanical filter; and
   an actuator configured to exert forces on an element in an optical system of a projection exposure apparatus, the actuator comprising:
      a first actuator part coupled to the carrying frame via the mechanical filter; and a second actuator part mechanically coupled directly to the carrying frame, wherein:
when the actuator exerts forces on the element, a loading on the first actuator part is at least partly relieved by the second actuator part; and
during driving of the actuator, an input signal defining an overall force to be exerted on the element by the actuator is split into signals corresponding to different frequency ranges, a sum of the signals being equal to the input signal.

14. The arrangement of claim 5, wherein, when the actuator exerts forces on the element, at least 80% of the forces exerted on the element with a frequency below the filter frequency of the mechanical filter are exerted by the second actuator part.

15. The arrangement of claim5, wherein the arrangement is configured so that, when the actuator exerts forces on the element, at least 80% of static forces exerted on the element by the actuator are exerted by the second actuator part.

16. The arrangement of claim 5, wherein the filter frequency of the mechanical filter is in the range of 2 Hz to 100 Hz.

17. The arrangement of claim 5, wherein the arrangement is configured so that the forces to be exerted on the element by the actuator comprise forces which are predefined by a control, and the predefined forces are exerted on the element by the second actuator part.

18. The arrangement of claim 5, wherein at least one actuator part comprises a Lorentz actuator comprising a coil and a permanent magnet, the at least one actuator comprising at least one member selected from the group consisting of the first actuator part and the second actuator part.

19. The arrangement of claim 5, wherein the first actuator part comprises a Lorentz actuator comprising a coil and a permanent magnet, and the permanent magnet is a filter mass of the mechanical filter.

20. The arrangement of claim 5, further comprising the element, wherein the element comprises a mirror.

21. The arrangement of claim 5, further comprising the element, wherein the element comprises a lens.

22. The arrangement of claim 5, further comprising the element, wherein the element comprises a movable table configured to position an element, wherein the element is selected from the group consisting of a member to be imaged, a member to be processed, and a member to be inspected.

23. The arrangement of claim 13, wherein, when the actuator exerts forces on the element, at least 80% of the forces exerted on the element with a frequency below a filter frequency of the mechanical filter are exerted by the second actuator part.

24. The arrangement of claim 13, wherein the arrangement is configured so that, when the actuator exerts forces on the element, at least 80% of static forces exerted on the element by the actuator are exerted by the second actuator part.

25. The arrangement of claim 13, wherein a filter frequency of the mechanical filter is in the range of 2 Hz to 100 Hz.

26. The arrangement of claim 13, wherein the arrangement is configured so that the forces to be exerted on the element by the actuator comprise forces which are predefined by a control, and the predefined forces are exerted on the element by the second actuator part.

27. The arrangement of claim 13, wherein at least one actuator part comprises a Lorentz actuator comprising a coil and a permanent magnet, the at least one actuator comprising at least one member selected from the group consisting of the first actuator part and the second actuator part.

28. The arrangement of claim 13, wherein the first actuator part comprises a Lorentz actuator comprising a coil and a permanent magnet, and the permanent magnet is a filter mass of the mechanical filter.

29. The arrangement of claim 13, further comprising the element, wherein the element comprises a mirror.

30. The arrangement of claim 13, further comprising the element, wherein the element comprises a lens.

31. The arrangement of claim 13, further comprising the element, wherein the element comprises a movable table configured to position an element, wherein the element is selected from the group consisting of a member to be imaged, a member to be processed, and a member to be inspected.

32. An arrangement, comprising:
a carrying frame;
a mechanical filter having a frequency;
an actuator configured to exert forces on an element in an optical system of a projection exposure apparatus, the actuator comprising:
a first actuator part coupled to the carrying frame via the mechanical filter; and
a second actuator part mechanically coupled directly to the carrying frame; and
a frequency-dividing network comprising a low-pass filter and a high-pass filter; and
a controller configured to control the forces exerted on the element by the actuator based on a sensor signal characteristic of a position of the element,
wherein when the actuator exerts forces on the element:
a loading on the first actuator part is at least partly relieved by the second actuator part; and
forces exerted on the element with a frequency below the filter frequency of the mechanical filter are at least predominantly exerted by the second actuator part, and
wherein:
the controller is configured to communicate a controller output variable determined based on a sensor signal to the frequency-dividing network; and
based on the controller output variable received by the frequency-dividing network, the frequency-dividing network is configured to provide a first signal to the first actuator part and a second signal to the second actuator part.

33. The arrangement of claim 32, wherein, when the actuator exerts forces on the element, at least 80% of the forces exerted on the element with a frequency below the filter frequency of the mechanical filter are exerted by the second actuator part.

34. The arrangement of claim 32, wherein the arrangement is configured so that, when the actuator exerts forces on the element, at least 80% of static forces exerted on the element by the actuator are exerted by the second actuator part.

35. The arrangement of claim 32, wherein the filter frequency of the mechanical filter is in the range of 2 Hz to 100 Hz.

36. The arrangement of claim 32, wherein the arrangement is configured so that the forces to be exerted on the element by the actuator comprise forces which are predefined by a control, and the predefined forces are exerted on the element by the second actuator part.

37. The arrangement of claim 32, wherein at least one actuator part comprises a Lorentz actuator comprising a coil and a permanent magnet, the at least one actuator comprising at least one member selected from the group consisting of the first actuator part and the second actuator part.

38. The arrangement of claim 32, wherein the first actuator part comprises a Lorentz actuator comprising a coil and a permanent magnet, and the permanent magnet is a filter mass of the mechanical filter.

39. The arrangement of claim 32, further comprising the element, wherein the element comprises a mirror.

40. The arrangement of claim 32, further comprising the element, wherein the element comprises a lens.

41. The arrangement of claim 32, further comprising the element, wherein the element comprises a movable table configured to position an element, wherein the element is selected from the group consisting of a member to be imaged, a member to be processed, and a member to be inspected.

\* \* \* \* \*

UNITED STATES PATENT AND TRADEMARK OFFICE
CERTIFICATE OF CORRECTION

| | | |
|---|---|---|
| PATENT NO. | : 9,081,292 B2 | Page 1 of 1 |
| APPLICATION NO. | : 14/022819 | |
| DATED | : July 14, 2015 | |
| INVENTOR(S) | : Markus Hauf and Ulrich Schoenhoff | |

It is certified that error appears in the above-identified patent and that said Letters Patent is hereby corrected as shown below:

Claims

Col. 11, line 17, Claim 15, delete "claim5," and insert -- claim 5, --.

Signed and Sealed this
Twenty-third Day of February, 2016

Michelle K. Lee
*Director of the United States Patent and Trademark Office*